(12) United States Patent
Lee et al.

(10) Patent No.: US 10,984,844 B2
(45) Date of Patent: *Apr. 20, 2021

(54) APPARATUSES AND METHODS FOR DETERMINING A PHASE RELATIONSHIP BETWEEN AN INPUT CLOCK SIGNAL AND A MULTIPHASE CLOCK SIGNAL

(71) Applicant: MICRON TECHNOLOGY, INC., Boise, ID (US)

(72) Inventors: Hyun Yoo Lee, Boise, ID (US); Kang-Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/452,436

(22) Filed: Jun. 25, 2019

(65) Prior Publication Data

US 2019/0311753 A1    Oct. 10, 2019

Related U.S. Application Data

(60) Continuation of application No. 16/143,082, filed on Sep. 26, 2018, now Pat. No. 10,515,676, which is a
(Continued)

(51) Int. Cl.
*G11C 7/22* (2006.01)
*G11C 7/10* (2006.01)
*G11C 11/4076* (2006.01)

(52) U.S. Cl.
CPC .............. *G11C 7/222* (2013.01); *G11C 7/109* (2013.01); *G11C 11/4076* (2013.01); *G11C 2207/2272* (2013.01)

(58) Field of Classification Search
CPC .............. G11C 7/222; G11C 8/18; G11C 8/10
See application file for complete search history.

(56) References Cited

U.S. PATENT DOCUMENTS

| 4,415,984 A | 11/1983 | Gryger et al. |
| 6,029,252 A | 2/2000 | Manning |

(Continued)

FOREIGN PATENT DOCUMENTS

| KR | 100910852 B1 | 8/2009 |
| KR | 10-2010-0083365 A | 7/2010 |

(Continued)

OTHER PUBLICATIONS

International Search Report and Written Opinion received for PCT Application No. PCT/US2018/019861, dated Jun. 14, 2018.

(Continued)

*Primary Examiner* — Khamdan N. Alrobaie
(74) *Attorney, Agent, or Firm* — Dorsey & Whitney LLP

(57) ABSTRACT

Apparatuses and methods for determining a phase relationship between an input clock signal and a multiphase clock signal are disclosed. An example apparatus includes a clock path configured to receive a clock signal and provide internal clock signals and a command path configured to receive a command and propagate the command through the command path responsive to the internal clock signals and provide an internal command having a timing that reflects a timing of the clock signal. The example apparatus further includes a data clock path configured to receive a data clock signal and provide multiphase clock signals based on the data clock signal and provide a delayed multiphase clock signal, and further includes a clock synchronization circuit configured to receive the delayed multiphase clock signal and latch a logic level of the delayed multiphase clock signal responsive to the internal command.

20 Claims, 7 Drawing Sheets

Related U.S. Application Data division of application No. 15/445,935, filed on Feb. 28, 2017, now Pat. No. 10,210,918.

(56) References Cited

U.S. PATENT DOCUMENTS

| | | |
|---|---|---|
| 6,178,133 B1 | 1/2001 | Manning |
| 6,178,488 B1 | 1/2001 | Manning |
| 6,202,119 B1 | 3/2001 | Manning |
| 6,239,631 B1 | 5/2001 | Fujioka et al. |
| 6,279,090 B1 | 8/2001 | Manning |
| 6,301,322 B1 | 10/2001 | Manning |
| 6,338,127 B1 | 1/2002 | Manning |
| 6,434,684 B1 | 8/2002 | Manning |
| 6,446,180 B2 | 9/2002 | Li et al. |
| 6,484,244 B1 | 11/2002 | Manning |
| 6,598,171 B1 | 7/2003 | Farmwald et al. |
| 7,103,855 B2 | 9/2006 | Saeki |
| 9,531,363 B2 | 12/2016 | Miyano |
| 10,090,026 B2 | 10/2018 | Lee et al. |
| 10,210,918 B2 | 2/2019 | Lee et al. |
| 10,269,397 B2 | 4/2019 | Lee |
| 10,515,676 B2 | 12/2019 | Lee et al. |
| 10,534,394 B2 | 1/2020 | Lee et al. |
| 2001/0028599 A1 | 10/2001 | Aikawa |
| 2005/0253629 A1 | 11/2005 | Zivanovic |
| 2007/0070731 A1* | 3/2007 | Choi .................. G11C 7/1057 365/194 |
| 2007/0086267 A1 | 4/2007 | Kwak |
| 2007/0133332 A1 | 6/2007 | Chun |
| 2008/0056019 A1 | 3/2008 | Kim et al. |
| 2008/0291759 A1 | 11/2008 | Lee |
| 2009/0168546 A1* | 7/2009 | Kim .................. G11C 7/1093 365/189.05 |
| 2009/0251181 A1* | 10/2009 | Bae .................. H03L 7/06 327/156 |
| 2010/0254198 A1 | 10/2010 | Bringivijayaraghavan et al. |
| 2010/0302828 A1 | 12/2010 | Park |
| 2010/0310029 A1* | 12/2010 | Na .................. G11C 7/222 375/371 |
| 2011/0116330 A1 | 5/2011 | Kim et al. |
| 2011/0158030 A1* | 6/2011 | Bae .................. H03L 7/06 365/233.1 |
| 2011/0316599 A1 | 12/2011 | Kwak |
| 2012/0306554 A1 | 12/2012 | Ma et al. |
| 2013/0265835 A1 | 10/2013 | Lee |
| 2013/0329503 A1 | 12/2013 | Bringivijayaraghavan |
| 2014/0010025 A1 | 1/2014 | Bringivijayaraghavan |
| 2014/0015575 A1 | 1/2014 | Jung |
| 2014/0055184 A1 | 2/2014 | Vankayala |
| 2014/0313837 A1 | 10/2014 | Kwak |
| 2014/0340135 A1 | 11/2014 | Balluchi et al. |
| 2015/0187404 A1 | 7/2015 | Oh |
| 2015/0235691 A1 | 8/2015 | Kwak |
| 2017/0140808 A1 | 5/2017 | Jung et al. |
| 2018/0247683 A1 | 8/2018 | Lee et al. |
| 2018/0247690 A1 | 8/2018 | Lee et al. |
| 2019/0027197 A1 | 1/2019 | Lee et al. |
| 2019/0027199 A1 | 1/2019 | Lee et al. |
| 2019/0066741 A1 | 2/2019 | Lee |
| 2019/0163653 A1 | 5/2019 | Kim et al. |
| 2019/0189168 A1 | 6/2019 | Lee |
| 2019/0317545 A1 | 10/2019 | Lee et al. |
| 2020/0020380 A1 | 1/2020 | Shin et al. |
| 2020/0111523 A1* | 4/2020 | Lee .................. G06F 11/1068 |
| 2020/0143858 A1* | 5/2020 | Kim .................. G11C 7/1093 |
| 2020/0143859 A1 | 5/2020 | Lee et al. |
| 2020/0176038 A1 | 6/2020 | Kim |

FOREIGN PATENT DOCUMENTS

| | | |
|---|---|---|
| KR | 101499176 B1 | 3/2015 |
| WO | 2019046013 A1 | 3/2019 |

OTHER PUBLICATIONS

U.S. Appl. No, 16/273,562 titled "Apparatuses and Methods for Providing Active and Inactive Clock Signals", filed Feb. 12, 2019, pp. all.

KR Office Action dated Aug. 24, 2020 for KR Application No. 10-2019-7028140.

EESR dated Nov. 23, 2020 for EP Application No. 18761278.3, 8 pgs.

* cited by examiner

APPARATUSES AND METHODS FOR DETERMINING A PHASE RELATIONSHIP BETWEEN AN INPUT CLOCK SIGNAL AND A MULTIPHASE CLOCK SIGNAL

CROSS-REFERENCE TO RELATED APPLICATIONS

This application is a continuation of U.S. patent application Ser. No. 16/143,082, filed Sep. 26, 2018, issued as U.S. Pat. No. 10,515,676 on Dec. 24, 2019, which is a divisional of U.S. patent application Ser. No. 15/445,935, filed Feb. 28, 2017, issued as U.S. Pat. No. 10,210,918 on Feb. 19, 2019. These applications and patents are incorporated by reference herein in their entirety and for all purposes.

BACKGROUND

Semiconductor memories are used in many electronic systems to store data that may be retrieved at a later time. As the demand has increased for electronic systems to be faster, have greater computing ability, and consume less power, semiconductor memories that may be accessed faster, store more data, and use less power have been continually developed to meet the changing needs. Part of the development includes creating new specifications for controlling and accessing semiconductor memories, with the changes in the specifications from one generation to the next directed to improving performance of the memories in the electronic systems.

Semiconductor memories are generally controlled by providing the memories with command signals, address signals, clock signals. The various signals may be provided by a memory controller, for example. The command signals may control the semiconductor memories to perform various memory operations, for example, a read operation to retrieve data from a memory, and a write operation to store data to the memory. With newly developed memories, the memories may be provided with system clock signals that are used for timing command signals and address signals, for example, and further provided with data clock signals that are used for timing read data provided by the memory and for timing write data provided from the memory.

In typical designs, read data is provided by a memory with known timing relative to receipt of an associated read command by the memory. The known timing is defined by read latency information RL. Similarly, write data is received by a memory with known timing relative to receipt of an associated write command by the memory. The known timing is defined by write latency information WL. The RL information and WL information are typically defined by numbers of clock cycles of system clock signals CK and CKF. For example, RL information may define a RL of 18 clock cycles of the system clock signals (tCKs). As a result, read data will be provided by a memory in 18 tCKs after the read command is received by the memory. The RL information and WL information may be programmed in the memory by a memory controller.

With regards to memory designs using data clock signals, the data clock signals are provided to a memory (e.g., from a memory controller) to synchronize provision of read data or receipt of write data by the memory. The data clock signals are provided according to a specification with a timing relative to receipt of a memory command in order to provide data or receive data to satisfy the RL/WL information. The memory responds to the active data clock signals and provides or receives the data accordingly.

Clock circuits included in a semiconductor memory may be used to generate internal clock signals that are used for performing various operations. For example, some clock circuits may provide multiphase clock signals based on the data clock signals. The multiphase clock signals may be used, for example, for timing the provision and/or receipt of data by the memory. The multiphase clock signals have relative phases with one another (e.g., 90 degrees) and with the data clock signals. In some memories, the clock circuits provide the multiphase clock signals having a phase relationship relative to the data clock signals that is unknown until determined by evaluation of one or more of the multiphase clock signals.

Determination of the phase relationship between the multiphase clock signals and the data clock signals may be required for proper operation of the memory. In such situations, the determination should be made quickly and efficiently so that proper operation of the memory may begin or resume with minimal delay and power consumption.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
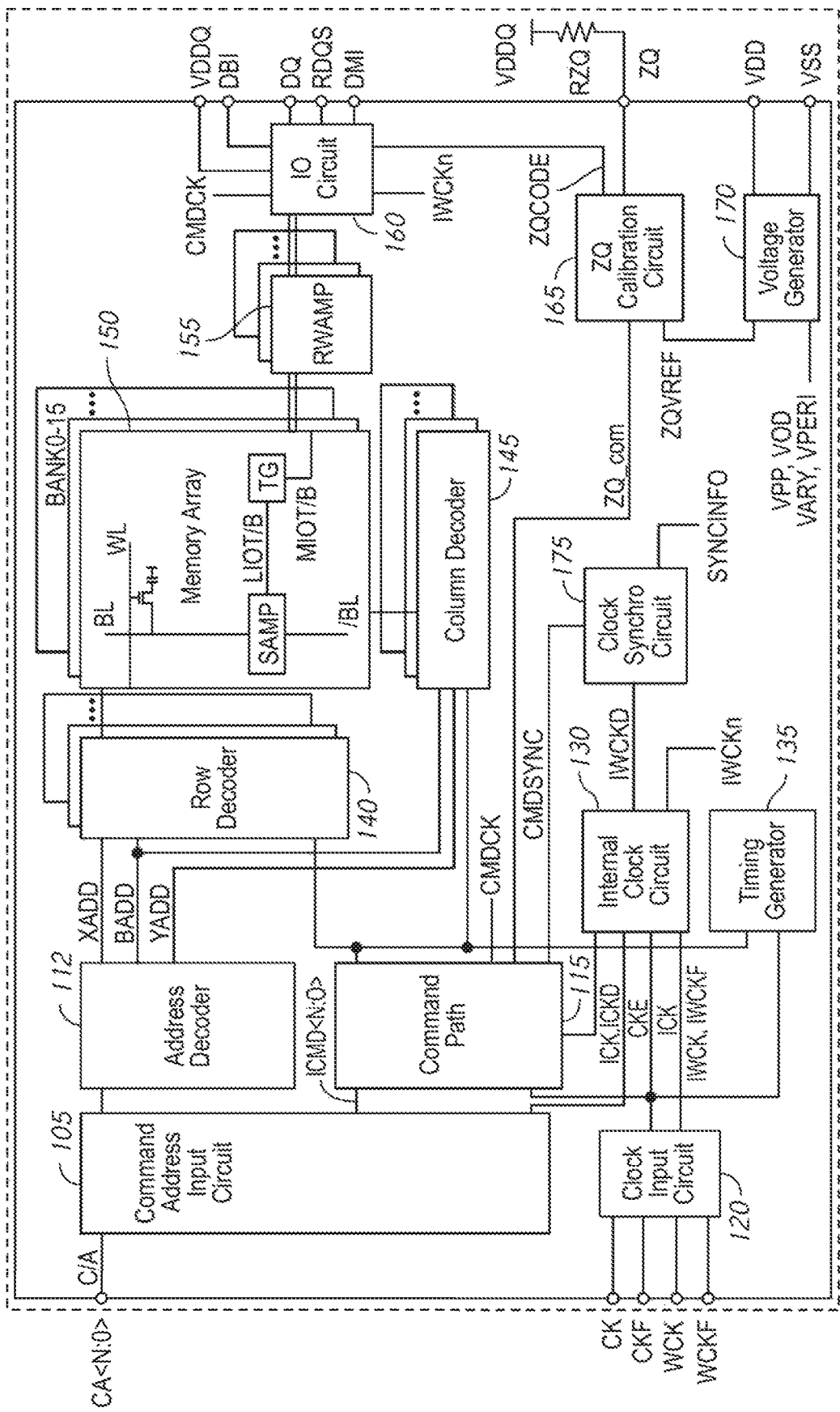
FIG. 1 is a block diagram of an apparatus according to an embodiment of the invention.

FIG. 1 is a block diagram of an apparatus according to an embodiment of the disclosure. The apparatus may be a semiconductor device 100, and will be referred as such. In some embodiments, the semiconductor device 100 may include, without limitation, a DRAM device, such as low power DDR (LPDDR) memory integrated into a single semiconductor chip, for example. The semiconductor device 100 includes a memory die. The die may be mounted on an external substrate, for example, a memory module substrate, a mother board or the like. The semiconductor device 100 may further include a memory array 150. The memory array 150 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 140 and the selection of the bit line BL is performed by a column decoder 145. Sense amplifiers (SAMP) are located for their corresponding bit lines BL and connected to at least one respective local I/O line pair (LIOT/B), which is in turn coupled to at least respective one main I/O line pair (MIOT/B), via transfer gates (TG), which function as switches.

The semiconductor device 100 may employ a plurality of external terminals that include command and address terminals coupled to command/address bus to receive command/address signals CA<N:0>, clock terminals to receive clock signals CK and CKF, data clock terminals to receive data clock signals WCK and WCKF, data terminals DQ, RDQS, DBI, and DMI, power supply terminals VDD, VSS, VDDQ, and VSSQ, and the ZQ calibration terminal (ZQ).

The command/address terminals may be supplied with an address signal and a bank address signal from outside. The address signal and the bank address signal supplied to the address terminals are transferred, via the command/address input circuit 105, to an address decoder 112. The address decoder 112 receives the address signal and supplies a decoded row address signal to the row decoder 140, and a decoded column address signal to the column decoder 145. The address decoder 112 also receives the bank address signal and supplies the bank address signal to the row decoder 140, the column decoder 145.

The command/address terminals may further be supplied with command signals CA<N:0> from outside, such as, for example, a memory controller. The command signals CA<N:0> may be provided as command signals ICMD<N:0> to a command path 115 via the command/address input circuit 105. The command path 115 includes circuits to decode the command signals ICMD<N:0> to generate various internal commands that include a row command signal to select a word line and a column command signal to select a bit line. The internal commands also include output and input activation commands, such as clocked command CMDCK, and a sync command CMDSYNC.

When a read command is issued and a row address and a column address are timely supplied with the read command, read data is read from a memory cell in the memory array 150 designated by these row address and column address. The read command is received by the command path 115, which provides internal commands to input/output circuit 160 so that read data is output to outside from the data terminals DQ, RDQS, DBI, and DMI via read/write amplifiers 155 and the input/output circuit 160 according to the WCK and WCKF clock signals. The read data is provided at a time defined by read latency information RL that may be programmed in the semiconductor device, for example, in a mode register (not shown in FIG. 1). The read latency information RL may be defined in terms of clock cycles of the CK clock signal. For example, the read latency information RL may be a number of clock cycles of the CK signal after the read command is received by the semiconductor device 100 when the associated read data is provided.

When the write command is issued and a row address and a column address are timely supplied with this command, then write data is supplied to the data terminals DQ, DBI, and DMI according to the WCK and WCKF clock signals, and the write command is received by the command path 115, which provides internal commands to the input/output circuit 160 so that the write data is received by data receivers in the input/output circuit 160, and supplied via the input/output circuit 160 and the read/write amplifiers 155 to the memory array 150 and written in the memory cell designated by the row address and the column address. The write data is provided to the data terminals at a time that is defined by write latency WL information. The write latency WL information may be programmed in the semiconductor device 100, for example, in the mode register (not shown in FIG. 1). The write latency WL information may be defined in terms of clock cycles of the CK clock signal. For example, the write latency information WL may be a number of clock cycles of the CK signal after the write command is received by the semiconductor device 100 when the associated write data is provided.

Turning to the explanation of the external terminals included in the semiconductor device 100, the clock terminals and data clock terminals are supplied with external clock signals and complementary external clock signals. The external clock signals CK, CKF, WCK, WCKF may be supplied to a clock input circuit 120. The clock input circuit 120 may receive the external clock signals to generate internal clock signals ICK and IWCK and IWCKF. The internal clock signals ICK and IWCK and IWCKF are supplied to internal clock circuits 130.

The internal clock circuits 130 includes circuits that provide various phase and frequency controlled internal clock signals based on the received internal clock signals and a clock enable signal CKE from the command/address input circuit 105. For example, the internal clock circuits 130 may include a clock path (not shown in FIG. 1) that receives the ICK clock signal and provides internal clock signals ICK and ICKD, where ICKD is the same as internal clock signal ICK but delayed relative to the ICK clock signal by a delay. The ICK and ICKD clock signals may be provided to the command path 115. The internal clock circuits 130 may further include a data clock path (not shown in FIG. 1) that receives the IWCK and IWCKF clock signals and provides multiphase clock signals IWCKn based on the internal clock signals IWCK and IWCKF. As will be described in more detail below, the multiphase clock signals IWCKn have relative phases with each other and have a phase relationship with the WCK and WCKF clock signals. The multiphase clock signals IWCKn may also be provided to the input/output circuit 160 for controlling an output timing of read data and the input timing of write data. The data clock path may also provide a delayed multiphase clock signal IWCKD, which is one of the multiphase clock signals IWCKn further delayed.

A clock synchronization circuit 175 is provided with the delayed multiphase clock signal IWCKD and the sync command CMDSYNC. As will be described in more detail below, the clock synchronization circuit provides an output signal SYNCINFO having a logic level that is indicative of a phase relationship between the multiphase clock signals IWCKn and the WCK and WCKF clock signals.

The power supply terminals are supplied with power supply potentials VDD and VSS. These power supply potentials VDD and VSS are supplied to an internal voltage generator circuit 170. The internal voltage generator circuit 170 generates various internal potentials VPP, VOD, VARY, VPERI, and the like and a reference potential ZQVREF based on the power supply potentials VDD and VSS. The internal potential VPP is mainly used in the row decoder 140, the internal potentials VOD and VARY are mainly used in the sense amplifiers included in the memory array 150, and the internal potential VPERI is used in many other circuit blocks. The reference potential ZQVREF is used in the ZQ calibration circuit 165.

The power supply terminal is also supplied with power supply potential VDDQ. The power supply potentials VDDQ is supplied to the input/output circuit 160 together with the power supply potential VSS. The power supply potential VDDQ may be the same potential as the power supply potential VDD in an embodiment of the disclosure. The power supply potential VDDQ may be a different potential from the power supply potential VDD in another embodiment of the disclosure. However, the dedicated power supply potential VDDQ is used for the input/output circuit 160 so that power supply noise generated by the input/output circuit 160 does not propagate to the other circuit blocks.

The calibration terminal ZQ is connected to the ZQ calibration circuit 165. The ZQ calibration circuit 165 performs a calibration operation with reference to an impedance of RZQ, and the reference potential ZQVREF, when activated by the ZQ calibration command ZQ_com. An impedance code ZQCODE obtained by the calibration operation is supplied to the input/output circuit 160, and thus an impedance of an output buffer (not shown) included in the input/output circuit 160 is specified.

Figure 2:
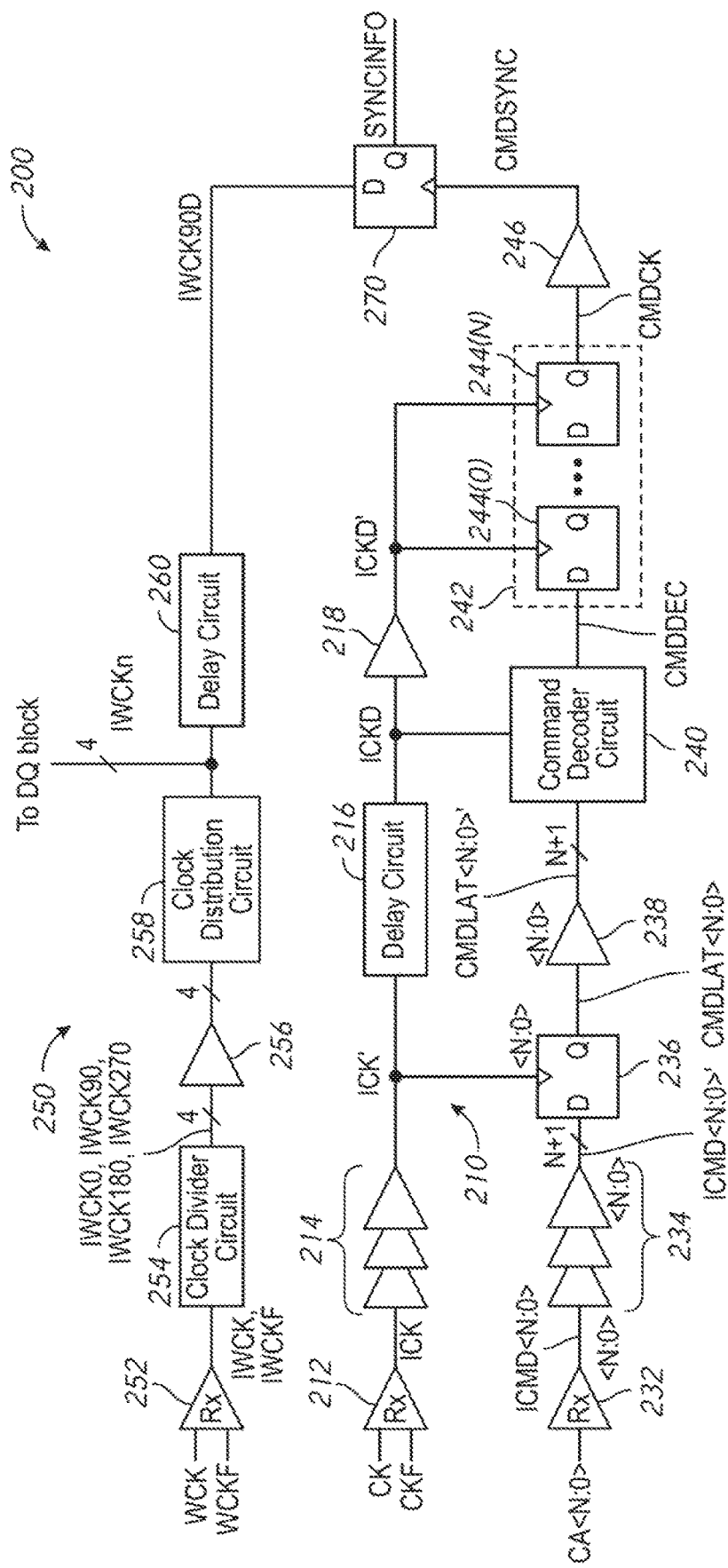
FIG. 2 is a block diagram of a portion of an apparatus according to an embodiment of the disclosure.

FIG. 2 is a block diagram of a portion of an apparatus according to an embodiment of the disclosure. The portion of the apparatus of FIG. 2 may be included in the semiconductor device 100 of FIG. 1, in some embodiments of the disclosure. The apparatus includes a clock path 210, a command path 230, a data clock path 250, and a clock synchronization circuit 270. One or more of the clock path 210, command path 220, or data clock path 230 may be modified while keeping any of the other paths the same without departing from the scope of the present disclosure.

The clock path 210 may include a receiver circuit 212 that receives complementary clock signals CK and CKF and provides an internal clock signal ICK. The receiver circuit 212 may be included in the clock input circuit 120 of FIG. 1. The internal clock signal ICK is based on the CK and CKF clock signals. Clock signals are complementary when a rising edge of a first clock signal occurs at the same time as a falling edge of a second clock signal, and when a rising edge of the second clock signal occurs at the same time as a falling edge of the first clock signal. Repeater circuits 214 receive the ICK clock signal and provide an ICK' clock signal to a delay circuit 216. The repeater circuits 214 drive the ICK' clock signal over a clock line from the receiver circuit 212 to the delay circuit 216. The ICK' clock signal is delayed by the delay circuit 216 to provide a delayed ICK clock signal ICKD. As will be described in more detail below, the delay circuit 216 models a propagation delay of circuits in the command path 230. A repeater circuit 218 receives the ICKD clock signal and provides the ICKD' clock signal to FF circuits 244(0)-244(N) of a command latency circuit 242. The repeater circuit 218 drives the ICKD' clock signal over clock lines to the FF circuits 244(0)-244(N).

The command path 230 may include a receiver circuits 232 that receive the command CA<N:0> and provide the command signals ICMD<N:0>. The receiver circuits 232 may be included in the command/address input circuit 105 of FIG. 1. The command CA<N:0> includes (N+1) binary digits ("bits") represented by (N+1) command signals and the command ICMD<N:0> includes (N+1) bits represented by (N+1) command signals, where N is a non-zero, positive number. The receiver circuits 232 includes (N+1) receiver circuits, with each receiver circuit receiving a respective one of the command signals of CA<N:0> and providing a respective command signal ICMD<N:0>.

The command signals ICMD<N:0> are provided to repeater circuits 234, which provides command signal ICMD<N:0>' to drive the command signals over command lines to flip-flop (FF) circuits 236. The repeater circuits 234 includes a plurality of groups of (N+1) repeater circuits. Each group of (N+1) repeater circuits is for one of the command signals ICMD<N:0>. The FF circuits 236 include (N+1) FF circuits, one FF circuit for each of the command signals ICMD<N:0>'. The command signals ICMD<N:0>' are latched by the FF circuits 236 and are provided as latched command signals CMDLAT<N:0>. The FF circuits 236 are clocked by the ICK' clock signal provided by the repeater circuits 214 of the clock path 210. The latched command signals CMDLAT<N:0> are then provided to repeater circuits 238, which drive the latched command signals CMDLAT<N:0>' over command lines to a command decoder circuit 240. The repeater circuits 238 include (N+1) repeater circuits, one for each of the CMDLAT signals.

The command decoder circuit 240 decodes the latched command signals CMDLAT<N:0>' and provides a decoded command CMDDEC. The command decoder circuit 240 may be clocked by the delayed internal clock ICKD' provided by the clock path 210. A command latency circuit 242 receives the decoded command CMDDEC and delays the decoded command by a delay according to command latency information LAT. The command latency information LAT may define a number of clock cycles of a clock signal, for example, the clock signal CK provided to the clock path 210, at which time data associated with a command is provided by the semiconductor device 100 (e.g., read data for an associated read command) or provided to the semiconductor device 100 (e.g., write data for an associated write command) following receipt of the associated command by the semiconductor device 100. The command latency information LAT may represent read latency information RL or the write latency information WL depending on the command CA<N:0> (e.g., a read command or a write command).

A propagation delay from the receiver circuit 212 through the repeater circuits 214 may be matched to a propagation delay from the receiver circuits 232 through the repeater circuits 234. In this manner, when command CA<N:0> is received by the receiver circuits 232 at the same time as a clock edge of the CK (and CKF) clock signal is received by the receiver circuit 212, the clock edge (for the clock signal ICLK') will clock the FF circuit 236 to latch the command signals ICMD<N:0>' for that command. A propagation delay through the repeater circuits 238 may be modeled by the delay circuit 216 so that any delay between the CMDLAT<N:0> signals provided by the FF circuit 236 and the CMDLAT<N:0>' signals received by the command decoder circuit 240 may be matched with delay between the ICK' clock signal and the delayed clock signal ICKD. The matching of the delays of the repeater circuits 238 and the delay circuit 216 will result in the clock edge of the CK clock signal received at the same time as the command CA<N:0> to also clock the command decoder circuit 240 to decode the CMDLAT<N:0>' signals for that command.

The command latency circuit 242 includes a plurality of FF circuits 244(0)-244(N) which are clocked by the delayed clock signal ICKD' to delay the decoded command CMDDEC that is provided by the command latency circuit 242 as a clocked command CMDCK. The delayed clock signal ICKD is provided by the clock path 210 as previously described. The clocked command CMDCK has a timing relative to the CK (and CKF) clock signals by virtue of the latching of the ICMD<N:0>' command signals by the FF latch circuits 236 according to the ICK' clock signal and the decoded command CMDDEC being clocked through the FF circuits 244(0)-244(N) by the ICKD' clock signal. As previously described, the ICK, ICK', ICKD and ICKD' clock signals are based on the CK and CKF clock signals. As a result, the clocked command CMDCK reflects a timing of the CK clock signal. The clocked command CMDCK may be referred to as having a timing in the CK clock domain. The clocked command CMDCK may be provided to activate circuits for performing the command. For example, for a read command the clocked command CMDCK may be provided to activate output circuits (e.g., in the IO circuits 160) to provide read data.

The clocked command CMDCK is provided to a repeater circuit 246 that drives the clocked command CMDCK over a command line to provide a sync command CMDSYNC to the clock synchronization circuit 270. The sync command CMDSYNC also has the timing relationship to the CK and CKF clock signals as previously described for the clocked command CMDCK. The clock synchronization circuit 270 may be a FF circuit in an embodiment of the disclosure, as illustrated in FIG. 2. Circuits other than a FF circuit may be included or substituted in the clock synchronization circuit 270 in other embodiments of the disclosure. The sync command CMDSYNC is used to clock the clock synchronization circuit 270. The clock synchronization circuit 270 latches a logic level of a IWCK90D clock signal provided by the data clock path 250 and provides an output signal SYNCINFO having the logic level of the latched IWCK90D clock signal. The command signals ICMD<N:0>, ICMD<N:0>', CMDLAT<N:0>, CMDLAT<N:0>', decoded command CMDDEC, clocked command CMDCK, and sync command CMDSYNC may be considered internal commands that are based on the command CA<N:0>.

The data clock path 250 receives complementary internal clock signals IWCK and IWCKF from a receiver circuit 252. The receiver circuit 252 receives complementary clock signals WCK and WCKF and provides the complementary internal clock signals IWCK and IWCKF based on the WCK and WCKF clock signals. The receiver circuit 252 may be included in the clock input circuit 120 of FIG. 1. The IWCK and IWCKF clock signals are provided to a clock divider circuit 254 that is configured to provide multiphase clock signals IWCK0, IWCK90, IWCK180, IWCK270 (collectively referred to as the multiphase clock signals IWCKn). The multiphase clock signals have relative phases to one another, and have a clock frequency that is less than a clock frequency of the WCK and WCKF clock signals. In an embodiment of the disclosure, the IWCK0, IWCK90, IWCK180, and IWCK270 clock signals have a relative phase of 90 degrees to one another. For example, the IWCK90 clock signal has a phase of 90 degrees relative to the IWCK0 clock signal, the IWCK180 clock signal has a phase of 180 degrees relative to the IWCK0 clock signal (and a phase of 90 degrees relative to the IWCK90 clock signal), and the IWCK270 clock signal has a phase of 270 degrees relative to the IWCK0 clock signal (and a phase of 90 degrees relative to the IWCK180 clock signal). In such a case, the multiphase clock signals IWCK0, IWCK90, IWCK180, IWCK270 may be referred to as "quadrature" phase clock signals. In an embodiment of the disclosure, the IWCK0, IWCK90, IWCK180, and IWCK270 clock signals have a clock frequency that is one-half the clock frequency of the WCK and WCKF clock signals.

The multiphase clock signals are provided to repeater circuits 256. The repeater circuits 256 include a repeater circuit for each of the multiphase clock signals IWCKn. The repeater circuits 256 drive the multiphase clock signals IWCKn over clock lines from the clock divider circuit 254 to a clock distribution circuit 258. The clock distribution circuit 258 provides the multiphase clock signals IWCKn to various circuitries that operate according to the multiphase clock signals. For example, the multiphase clock signals IWCKn may be provided to clock input/output circuits (not shown in FIG. 2) to provide and receive data (referenced in FIG. 2 as "To DQ block"). The clock distribution circuit 258 may also include circuits to change a voltage level of the clock signals in some embodiments of the disclosure. In an embodiment of the disclosure, the clock distribution circuit 258 includes circuits for shifting a voltage level of the high clock level from a lower voltage to a higher voltage to provide the multiphase clock signals IWCKn with the higher voltage high clock level. For example, a voltage level of a high clock level of the multiphase clock signals provided by the repeater 256 may be less than a voltage level of a high clock level of the multiphase clock signals IWCKn that are provided by the clock distribution circuit 258.

At least one of the multiphase clock signals IWCKn (IWCK0, IWCK90, IWCK180, and IWCK270) from the clock distribution circuit 258 is also provided to a delay circuit 260. The delay circuit 260 provides a clock signal having a delay relative to the multiphase clock signal provided by the clock distribution circuit 258. For example, in an embodiment of the disclosure, the IWCK90 clock signal is provided to the delay circuit 260, which provides the IWCK90D clock signal having a delay relative to the IWCK90 clock signal. The time of the delay may be based on a difference between a path delay of the data clock path 250 and a path delay of the command path 230, as clocked by the clock signals ICK, ICK', ICKD and ICKD' provided by the clock path 210. The path delay is generally the propagation delay of a signal through the path. The path delay of the data clock path 250 is the propagation delay from the receiver circuits 252 through the delay circuit 260 to the clock synchronization circuit 270. The path delay of the command path 230 is the propagation delay from the receiver circuits 232 through the repeater 246 to the clock synchronization circuit 270.

As previously described, the clock divider circuit 254 is configured to receive the IWCK and IWCKF clock signals and provide multiphase clock signals IWCK0, IWCK90, IWCK180, IWCK270. As also previously described, the IWCK and IWCKF clock signals are based on the WCK and WCKF clock signals. In an embodiment of the invention, the IWCK and IWCK clock signals have a same clock frequency as a clock frequency of the WCK and WCKF clock signals, and the IWCK clock signal corresponds to the WCK clock signal and the IWCKF clock signal corresponds to the WCKF clock signal.

The multiphase clock signals IWCKn provided by the clock divider circuit 254 have relative phases to one another and have a clock frequency that is less than a clock frequency of the WCK and WCKF clock signals (and the IWCK and IWCKF clock signals). In an embodiment of the disclosure, the multiphase signals have one-half the clock frequency of the IWCK and IWCKF clock signals. As a result, there are two clock cycles of the IWCK and IWCKF clock signals for one clock cycle of the multiphase clock signals IWCKn.

Figure 3:
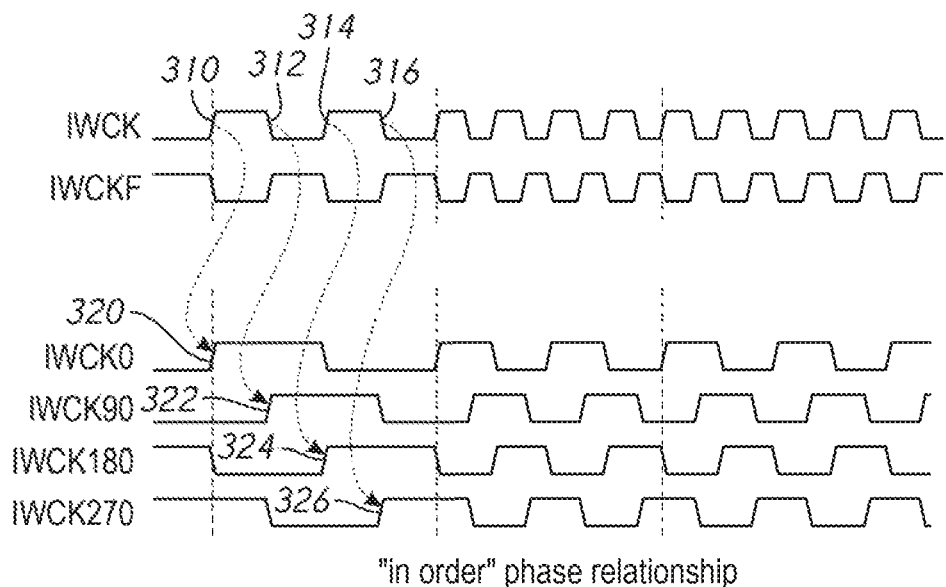
FIG. 3 is a timing diagram of various signals related to the operation of the clock divider circuit of the apparatus of FIG. 2 according to an embodiment of the disclosure.
Figure 3:
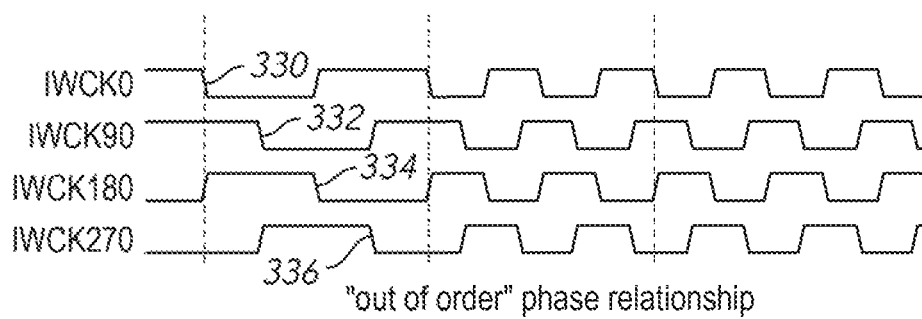

The multiphase clock signals IWCK0, IWCK90, IWCK180, and IWCK270 provided by the clock divider circuit 254 may have one of two phase relationships relative to the WCK and WCKF clock signals. A first phase relationship and a second phase relationship are illustrated in FIG. 3. In the first phase relationship, a rising edge 320 of the IWCK0 clock signal is associated with a first rising edge 310 of the IWCK (and WCK) clock signal, a rising edge 322 of the IWCK90 clock signal is associated with a first falling edge 312 of the IWCK/WCK clock signal, a rising edge 324 of the IWCK180 clock signal is associated with a second rising edge 314 of the IWCK/WCK clock signal, and a rising edge 326 of the IWCK270 clock signal is associated with a second falling edge 316 of the IWCK/WCK clock signal. The first phase relationship may be referred to as an "in order" phase relationship.

In the second phase relationship, a falling edge 330 of the IWCK0 clock signal is associated with the first rising edge 310 of the IWCK (and WCK) clock signal, a falling edge 332 of the IWCK90 clock signal is associated with the first falling edge 312 of the IWCK/WCK clock signal, a falling edge 334 of the IWCK180 clock signal is associated with the second rising edge 314 of the IWCK/WCK clock signal, and a falling edge 336 of the IWCK270 clock signal is associated with the second falling edge 316 of the IWCK/WCK clock signal. The second phase relationship may be referred to as an "out of order" phase relationship.

The first and second phase relationships are maintained even when a clock frequency of the WCK and WCKF (and IWCK and IWCKF) clock signals changes, for example, the clock frequency increases, as shown in FIG. 3 following the falling edge 316 of the IWCK clock signal.

The phase relationship of the multiphase clock signals IWCKn provided by the clock divider circuit 254 may not be known until a determination is made. The phase relationship of the multiphase clock signals IWCKn may be determined, for example, by evaluating at least one of the multiphase clock signals. As will be described in greater detail below, the output signal SYNCINFO provided by the clock synchronization circuit 270 provides information regarding the phase relationship of the multiphase clock signals IWCKn. For example, in the embodiment of the disclosure illustrated by FIG. 2, a logic level of the output signal SYNCINFO is indicative of the phase relationship of the multiphase clock signals IWCKn.

Determining the phase relationship of the multiphase clock signals IWCKn may be needed because proper operation of the semiconductor device 100 may be based on the multiphase clock signals having one of the phase relationships. For example, read data may be provided and write data received by the semiconductor device 100 properly when the multiphase clock signals have the "in order" phase relationship. In such an example, when it is determined that the multiphase clock signals IWCKn have the "out of order" phase relationship, various ones of the multiphase clock signals may be switched to provide "in order" multiphase clock signals. As an example, the IWCK180 clock signal and the IWCK0 clock signal of the out of order multiphase clock signals may be switched and the IWCK270 clock signal and the IWCK90 clock signal of the out of order multiphase clock signals may be switched. As a result, the "out of order" multiphase clock signals are switched into "in order" multiphase clock signals.

In an embodiment of the disclosure where a logic level of the output signal SYNCINFO is indicative of the phase relationship of the multiphase clock signals, the output signal SYNCINFO may be provided to control logic circuits or other circuits that control the switching of the multiphase clock signals. For example, when the output signal SYNC-INFO has a first logic level, indicating that the multiphase clock signals have a "in order" phase relationship, the control logic circuits may provide control signals to control switching circuits (e.g., multiplexer circuits) to not switch the multiphase clock signals. Conversely, when the output signal SYNCINFO has a second logic level, indicating that the multiphase clock signals have an "out of order" phase relationship, the control logic circuits may provide control signals to control the switching circuits to switch the multiphase clock signals so that the "out of order" multiphase clock signals are switched into "in order" multiphase clock signals. The output signal SYNCINFO may be used differently in other embodiments of the disclosure, and the approach for correcting the phase relationship of the multiphase clock signals may be different in other embodiments of the disclosure as well (e.g., controlling the clock divider circuit to provide multiphase signals having the correct phase relationship, inverting the multiphase clock signals, etc.).

Figure 4:
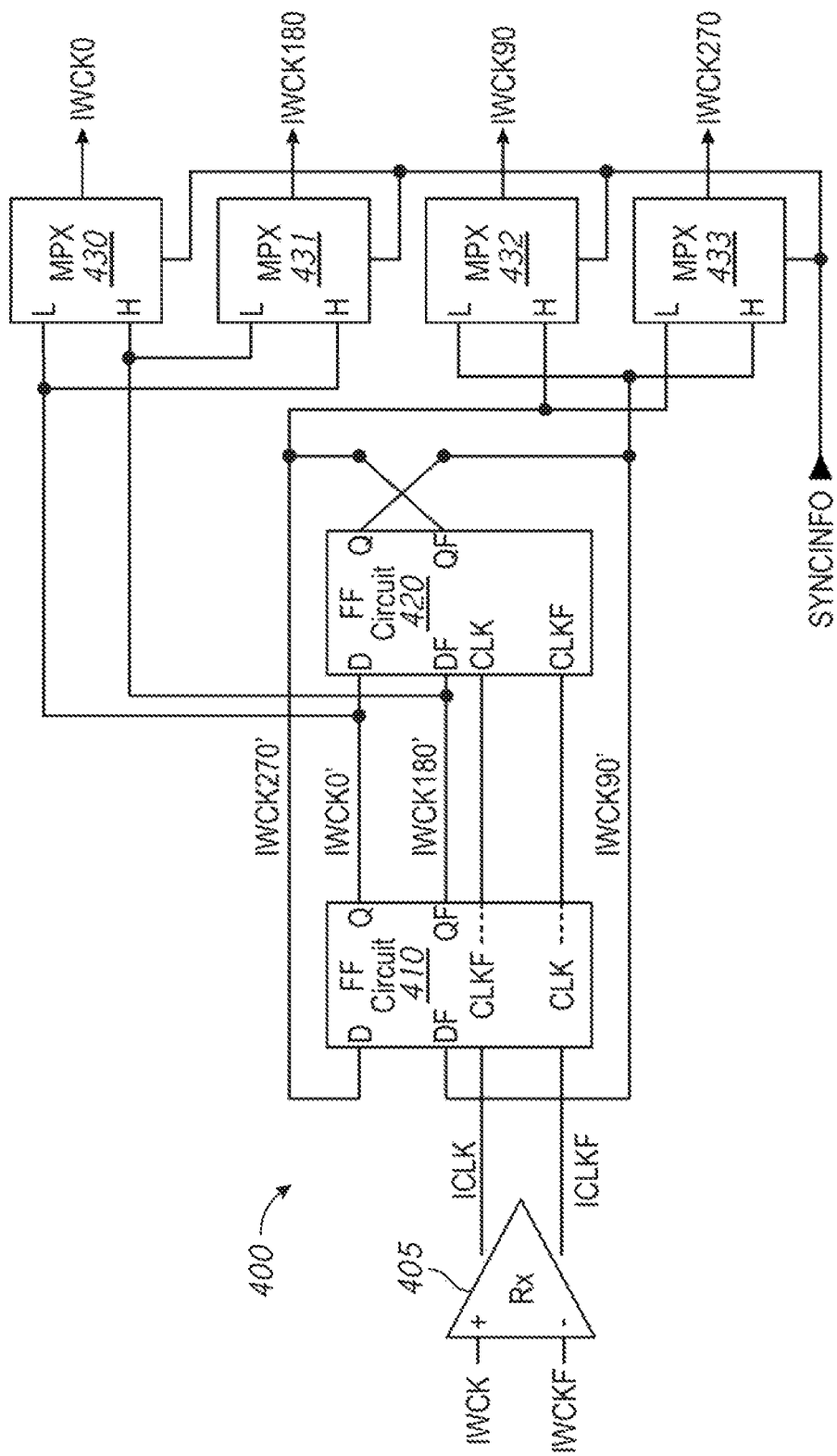
FIG. 4 is a schematic diagram of a clock divider circuit according to an embodiment of the disclosure.

FIG. 4 is a schematic diagram of a clock divider circuit 400 according to an embodiment of the disclosure. The clock divider circuit 400 may be used as the clock divider circuit 254 in an embodiment of the disclosure. The clock divider circuit 400 includes a receiver circuit 405 that receives complementary clock signals IWCK and IWCKF and provides complementary clock signals ICLK and ICLKF. The ICLK and ICLKF clock signals are provided to clock inputs of flip-flop (FF) circuits 410 and 420. The FF circuits 410 and 420 are clocked by the ICLK and ICLKF clock signals to receive complementary input signals at respective data inputs D and DF and provide complementary output signals at data outputs Q and QF. The IWCK0' clock signal is provided at data output Q of the FF circuit 410, the IWCK90' clock signal is provided at data output Q of the FF circuit 420, the IWCK180' clock signal is provided at data output QF of the FF circuit 410, and the IWCK270' clock signal is provided at data output QF of the FF circuit 420. The IWCK0' clock signal is provided to data input D of the FF circuit 420, the IWCK90' clock signal is provided to data input DF of the FF circuit 410, the IWCK180' clock signal is provided to data input DF of the FF circuit 420, and the IWCK270' clock signal is provided to data input D of the FF circuit 410. The clock divider circuit 400 may further include multiplexers (MPXs) 430 to 433. Each of the MPXs 431 and 432 may receive the IWCK0' and IMC180' clock signals, and each of the MPXs 432 and 433 receives IWCK90' and IWCK270' clock signals. In some embodiments of this disclosure, when the SYNCINFO signal is at a low logic level, the MPXs 430, 431, 432 and 433 may select and output the IWCK0' clock signal as an IWCK0 clock signal, the IWCK180' clock signal as an IWCK180 clock signal, the IWCK90' clock signal as an IWCK90 signal, and the IWCK270' clock signal as an IWCK270 signal, respectively. On the other hand, when the SYNC-INFO signal is at a high logic level, the MPXs 430, 431, 432 and 433 may select and output the IWCK180' clock signal as the IWCK0 clock signal, the IWCK0' clock signal as the IWCK180 clock signal, the IWCK270' clock signal as the IWCK90 clock signal, and the IWCK90' clock signal as the IWCK270 clock signal, respectively.

Operation of the clock divider circuit 400 will be described with reference to FIGS. 3 and 4. In operation, the clock divider circuit 400 provides multiphase clock signals IWCK0, IWCK90, IWCK180, and IWCK270 having a 90 degree relative phase to one another. The multiphase clock signals are based on the IWCK and IWCKF clock signals, which are as previously described, may be based on the WCK and WCKF clock signals. The clock divider circuit 400 provides the multiphase clock signals having a clock frequency that is one-half of a clock frequency of the IWCK and IWCKF clock signals. As a result, two clock cycles of the IWCK and IWCKF clock signals takes the same time as one clock cycle of the multiphase clock signals.

As the IWCK and IWCKF (and ICLK and ICLKF) clock signals clock between high and low clock levels, the FF circuits 410 and 420 are clocked to receive the logic levels applied to the respective data inputs D and DF and provide the logic levels at the respective data outputs Q and QF. As the logic levels of the outputs change, the logic levels at the data inputs D and DF to which the respective clock signals IWCK0', IWCK90', IWCK180', and IWCK270' are applied changes. As a result, when the IWCK and IWCKF clock signals clock again between high and low clock levels, the new logic levels at the respective data inputs D and DF are received and provided at the respective data outputs Q and QF. The continual clocking of the IWCK and IWCKF clock signals cause the logic levels at the data inputs and data outputs to change continually and periodically. Due to the FF circuits 410 and 420 being coupled in series, the resulting multiphase clock signals IWCK0, IWCK90, IWCK180, and IWCK270 have one-half the clock frequency of the IWCK and IWCKF (and ICLK and ICLKF) clock signals.

The clock divider circuit 400 may provide the multiphase clock signals IWCK0, IWCK90, IWCK180, IWCK270 having one of the two phase relationships previously described with reference to FIG. 3. In particular, the clock divider circuit 400 may provide the multiphase clock signals IWCK0, IWCK90, IWCK180, IWCK270 having the first phase relationship (e.g., "in order") where the rising edges of the multiphase clock signals are associated with the clock edges of the IWCK clock signal, or having the second phase relationship (e.g., "out of order") where the falling edges of the multiphase clock signals clock signals are associated with the clock edges of the IWCK clock signal.

With reference to FIG. 2, the phase relationship of the multiphase clock signals IWCK0, IWCK90, IWCK180, and IWCK270 with the WCK and WCKF clock signals may be determined by evaluating the IWCK90D clock signal when the sync command CMDSYNC becomes active. When the sync command CMDSYNC becomes active the clock synchronization circuit 270 is clocked to latch a logic level of the IWCK90D clock signal and provide the latched logic level as the output signal SYNCINFO. As will be described in more detail below, the resulting logic level of the output signal SYNCINFO indicates whether the multiphase clock signals have the first phase relationship or the second phase relationship with the WCK and WCKF clock signals.

Figure 5:
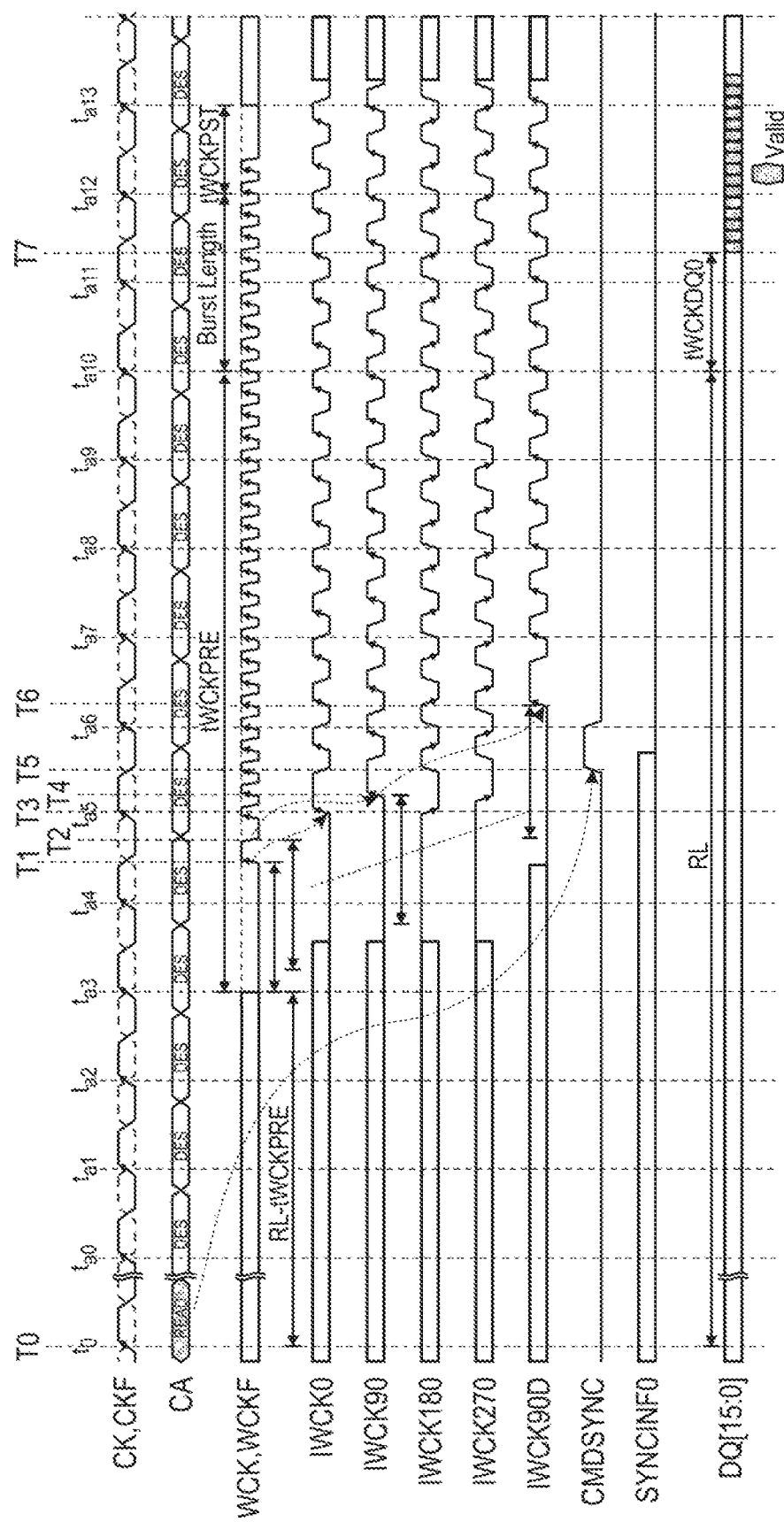
FIG. 5 is a timing diagram of various signals related to operation of the apparatus of FIG. 2 according to an embodiment of the disclosure.
Figure 6:
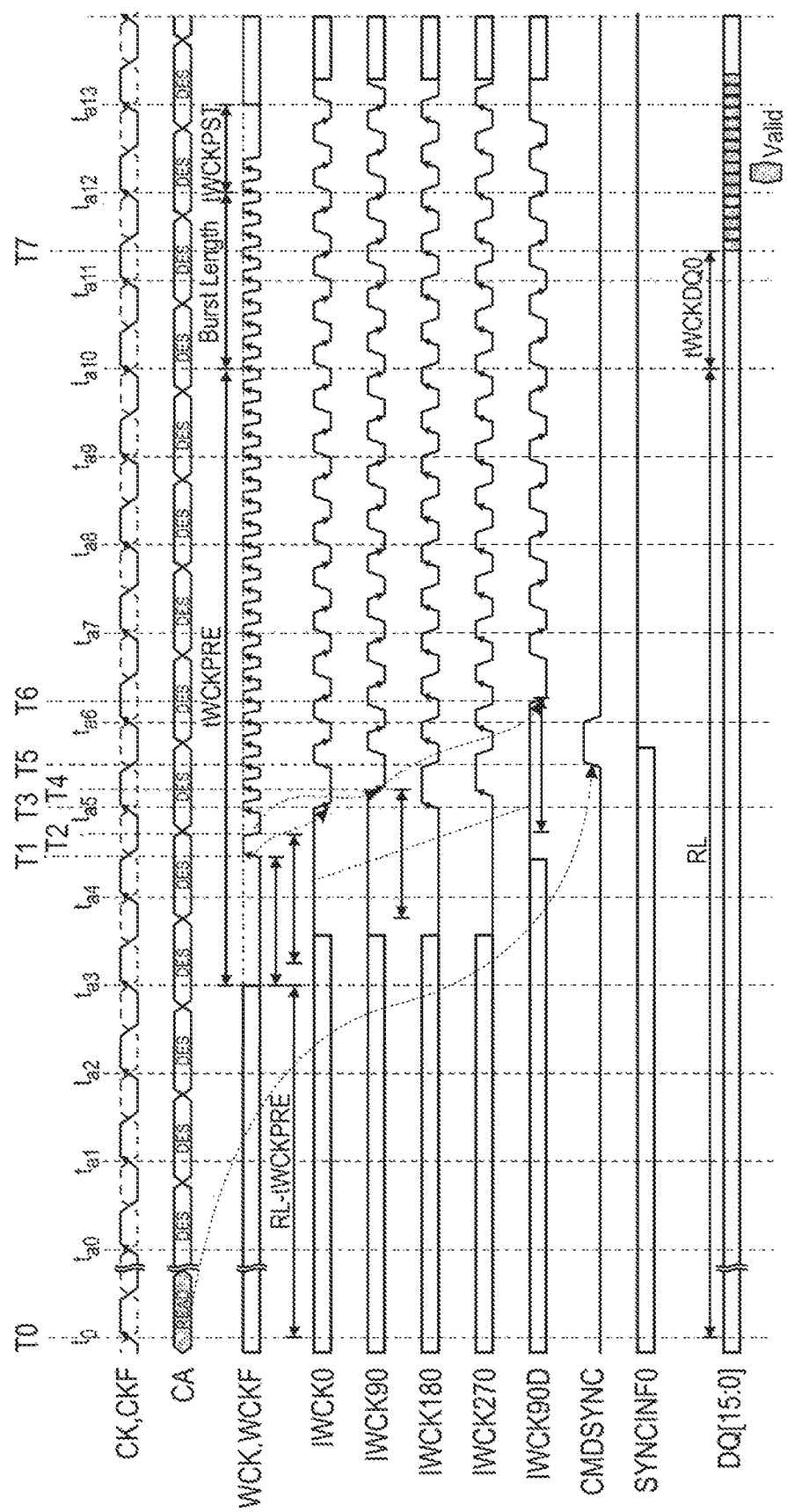
FIG. 6 is a timing diagram of various signals related to operation of the apparatus of FIG. 2 according to an embodiment of the disclosure.

FIGS. 5 and 6 are timing diagrams of various signals related to operation of the apparatus of FIG. 2 according to an embodiment of the disclosure. FIGS. 5 and 6 illustrate the various signals in the context of a read operation performed responsive to a read command. Read data DQ is provided at a time defined by read latency information RL relative to receipt of the read command. With regards to determining the phase relationship of the multiphase clock signals IWCK0, IWCK90, IWCK180, and IWCK270 with the WCK and WCKF clock signals, FIG. 5 illustrates the first phase relationship ("in order") and FIG. 6 illustrates the second phase relationship ("out of order"). A logic level of the output signal SYNCINFO has a logic level indicative of the determined phase relationship. For example, FIG. 5 illustrates the output signal SYNCINFO having a low logic level indicative of the "in order" first phase relationship and FIG. 6 illustrates the output signal SYNCINFO having a high logic level indicative of the "out of order" second phase relationship.

With reference to FIGS. 2 and 5, a read command READ is received by the receiver circuits 232 at a rising edge of the CK clock signal at time T0. The read command READ (represented by command CA<N:0>) is provided through repeater circuits 234 to the FF circuits 236. The rising edge of the CK clock signal at time T0 is provided as the ICK and ICKF clock signals to clock the FF circuits 236 to latch the read command. The latched read command is provided through the repeater circuits 238 to the command decoder circuit 240 and the rising edge of the ICK (which corresponds to the rising edge of the CK clock signal at time T0) is delayed by the delay circuit 216 to be used as the ICKD clock signal to clock the command decoder circuit 240 to decode the read command. The decoder circuit 240 provides the decoded read command to the command latency circuit 242 to add delay to the decoded read command according to the read latency information RL. The FF circuits 244(0)-244(N) are clocked by the ICKD clock signal to shift the decoded read command through the command latency circuit 242. The FF circuit 244(0) is clocked by the rising edge of the ICKD clock signal that corresponds to the rising edge of the CK clock signal at time T0. The propagation of the read command READ is not shown in detail in FIG. 5, but those of ordinary skill in the art have sufficient understanding from the present description.

At time T1 the WCK and WCKF clock signals become active. The active WCK and WCKF clock signals periodically change between the high clock level and low clock level. Prior to time T1, the WCK and WCKF clock signals are maintained at constant clock levels, which may be referred to as the "static period." In the embodiment of the disclosure illustrated in FIG. 5, the WCK clock signal is maintained at a low clock level for a static period of 1.5 clock cycles of the CK clock signal (i.e., 1.5 tCK). The static period for the WCK and WCKF clock signal is illustrated in FIG. 5 by the arrow preceding an initial rising edge of the WCK clock signal and also by the arrow preceding an initial falling edge of the WCK clock signal. While the static period is illustrated in FIG. 5 as 1.5 tCK, the length of the static period may be different in other embodiments of the disclosure. The WCK and WCKF clock signals are provided initially at a first clock frequency, but may be later provided at a second clock frequency that is higher than the first clock frequency. As illustrated in FIG. 5, the WCK and WCKF clock signals are provided at a first clock frequency for one clock cycle and then at twice the first frequency thereafter.

As previously described, the WCK and WCKF clock signals are provided through receiver circuits 252 to the clock divider circuit 254. The clock divider circuit 254 provides the multiphase clock signals IWCK0, IWCK90, IWCK180, and IWCK270 having a relative phase to one another and having a clock frequency that is lower than a clock frequency of the WCK and WCKF clock signals. FIG. 5 illustrates an embodiment of the disclosure where the IWCK0, IWCK90, IWCK180, and IWCK270 clock signals have a 90 degree phase relative to one another, and have a clock frequency that is one-half the clock frequency of the WCK and WCKF clock signals. In the embodiment of the disclosure illustrated by FIG. 5, a rising edge of the IWCK0 clock signal at time T3 is associated with a first rising edge of the WCK clock signal at time T1, a rising edge of the IWCK90 clock signal at time T4 is associated with a first falling edge of the WCK clock signal at time T2, a rising edge of the IWCK180 clock signal is associated with a second rising edge of the WCK clock signal, and a rising edge of the IWCK270 clock signal is associated with a second falling edge of the WCK clock signal.

The multiphase clock signals IWCK0, IWCK90, ICK180, and IWCK270 are provided through the clock distribution circuit 258 to clock input/output circuits that provide and receive data. The IWCK90 clock signal is delayed by the delay circuit 260 to provide the IWCK90D clock signal to the clock synchronization circuit 270 at time T6. The static period for the WCK and WCKF clock signals is also propagated through the clock path for each of the multiphase clock signals, and for IWCK90D clock signal, as illustrated in FIG. 5. The delay between the IWCK90 clock signal and the IWCK90D clock signal, which includes the delay of the delay circuit 260, is between time T4 and T6. A total path delay of the clock path from the receiver circuits 252 through the delay circuit 260 is between time T1 and T6.

While the WCK and WCKF clock signals are provided to the clock path and the multiphase IWCK0, IWCK90, IWCK180, and IWCK270 clock signals are provided to input/output circuits, as well as while the IWCK90D clock signal is provided to the clock synchronization circuit 270, the read command continues to propagate through the command path 230, including being shifted as the decoded command CMDDEC through the command latency circuit 242 by the ICKD clock signal. The read command is provided by a last FF circuit 244(N) as the clocked command CMDCK, which is then provided through the repeater circuit 246 to the clock synchronization circuit 270 as the sync command CMDSYNC. A rising edge of the sync command CMDSYNC is illustrated in FIG. 5 at time T5. The rising edge of the sync command CMDSYNC corresponds to the read command received at time T0. Read data DQ for the read command is provided at time T7, as defined by the read latency information RL.

The rising edge of the sync command CMDSYNC at time T5 clocks the clock synchronization circuit 270 to latch the logic level of the IWCK90D clock signal. As illustrated in FIG. 5, the sync command CMDSYNC clocks the clock synchronization circuit 270 during the static period of the IWCK90D clock signal. At time T5, the IWCK90D is at a low logic level, which results in an output signal SYNCINFO having a low logic level following time T5, as illustrated in FIG. 5. As previously described, the low logic level output signal SYNCINFO is indicative of an "in order" phase relationship between the multiphase clock signals IWCK0, IWCK90, IWCK180, and IWCK270 and the WCK and WCKF clock signals. The indication of the "in order" phase relationship is consistent with the rising edge of the IWCK0 clock signal at time T3 being associated with the rising edge of the WCK clock signal at time T1. As previously discussed with reference to FIG. 4, the clock divider circuit 400 continues to produce the multiphase clock signals IWCK0, IWCK90, IWCK180, and IWCK270 having the "in order" phase relationship.

By evaluating one of the multiphase clock signals (e.g., the IWCK90D clock signal) during its static period, the phase relationship of the multiphase clock signals with the WCK and WCKF clock signals may be determined sooner than waiting until after the static period, for example, waiting for the multiphase clock signals to be synchronized with the WCK and WCKF clock signals. Evaluating a multiphase clock signal during the static period may also allow for accurately determining the phase relationship with greater timing margin than compared to making a determination after the static period. Following the static period, the timing margin may be made narrower by duty cycle distortion of the clock signals, timing deviations in path delay due to process, voltage, and temperature variations, etc.

An example of an "out of order" phase relationship between the multiphase clock signals IWCK0, IWCK90, IWCK180, and IWCK270 and the WCK and WCKF clock signals will be described with reference to FIGS. 2 and 6.

FIG. 6 is similar to the timing diagram of FIG. 5, except that a falling edge of the IWCK0 clock signal at time T3 is associated with a first rising edge of the WCK clock signal at time T1, a falling edge of the IWCK90 clock signal at time T4 is associated with a first falling edge of the WCK clock signal at time T2, a falling edge of the IWCK180 clock signal is associated with a second rising edge of the WCK clock signal, and a falling edge of the IWCK270 clock signal is associated with a second falling edge of the WCK clock signal. In contrast, as previously described with reference to FIG. 5, the rising edge of the IWCK0 clock signal at time T3 is associated with the first rising edge of the WCK clock signal at time T1, and the rising edge of the IWCK90 clock signal at time T4 is associated with the first falling edge of the WCK clock signal at time T2.

The WCK90 clock signal is provided through delay circuit 260 to provide the IWCK90D clock signal. The falling edge of the IWCK90 clock signal at time T4 results in a falling edge of the IWCK90D clock signal at time T6. A high logic level static period of the IWCK90 clock signal results in a high logic level static period of the IWCK90D clock signal illustrated in FIG. 6 preceding the falling edge of the IWCK90D clock signal at time T6.

As with the example of FIG. 5, the read command READ at time T0 results in a rising edge of the sync command CMDSYNC at time T5. Read data DQ for the read command READ is provided at time T7, as defined by the read latency information RL. The rising edge of the sync command CMDSYNC at time T5 clocks the clock synchronization circuit 270 to latch the logic level of the IWCK90D clock signal at time T5. As illustrated in FIG. 6, the sync command CMDSYNC clocks the clock synchronization circuit 270 during the static period of the IWCK90D clock signal. The IWCK90D clock signal has a high logic level prior to time T6 during the static period of the IWCK90D clock signal as previously described. As a result, the clock synchronization circuit 270 provides an output signal SYNCINFO having a high logic level, as illustrated in FIG. 6 following time T5. As previously described, the high logic level output signal SYNCINFO is indicative of an "out of order" phase relationship of the multiphase clock signals IWCK0, IWCK90, IWCK180, and IWCK270 with the WCK and WCKF clock signals. The indication of the "out of order" phase relationship is inconsistent with the falling edge of the IWCK0 clock signal at time T3 being associated with the rising edge of the WCK clock signal at time T1. As previously discussed with reference to FIG. 4, the high logic level of the SYNCINFO signal causes the clock divider circuit 400 to change the multiphase clock signals IWCK0, IWCK90, IWCK180, and IWCK270 from the "out of order" phase relationship to the "in order" phase relationship.

Figure 7:
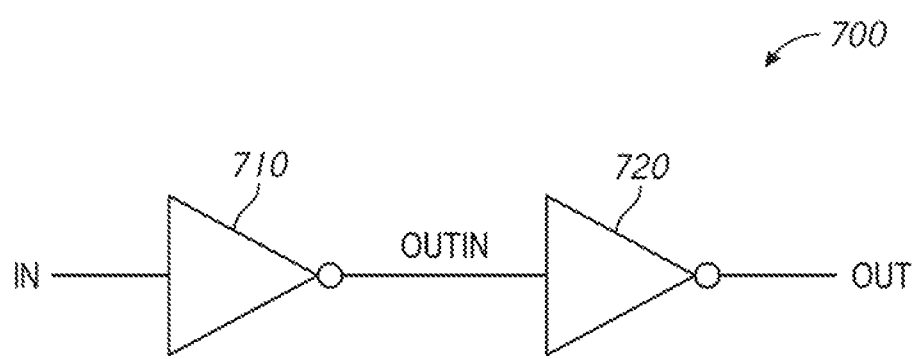
FIG. 7 is a schematic diagram of a repeater circuit according to an embodiment of the disclosure.

FIG. 7 is a schematic diagram of a repeater circuit 700 according to an embodiment of the disclosure. The repeater circuit 700 may be used as a repeater circuit in the clock path 210, the command path 220, and/or the data clock path 250 according to some embodiments of the disclosure.

The repeater circuit 700 includes an inverter circuit 710 and an inverter circuit 720. The inverter circuits 710 and 720 are coupled in series. Each of the inverter circuits 710 and 720 receives an input signal and provides an output signal that is the complement of the input signal. For example, when the inverter circuits receive an input signal having a high logic level, the inverter circuits provide an output signal having a low logic level. Conversely, when the inverter circuits receive an input signal having a low logic level, the inverter circuits provide an output signal having a high logic level. In providing the complement of the input signal as the output signal OUT, the inverter circuit drives the output signal OUT to voltages corresponding to the high and low logic levels.

In operation, an input signal IN is provided to the inverter circuit 710. The inverter circuit 710 provides an output signal OUTIN having the complementary logic level of the input signal IN. The output signal OUTIN is provided as an input signal to the inverter circuit 720. The inverter circuit 720 provides an output signal OUT having a complementary logic level of the input signal OUTIN. As a result of inverting the input signal IN to provide the output signal OUTIN, and then inverting the OUTIN signal to provide the output signal OUT, the resulting output signal OUT provided by the repeater circuit 700 has the same logic level as the input signal IN, and has been driven to the full voltages of the logic levels. The input signal IN has been repeated by driving the same logic level and to the full voltages of the corresponding logic level.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method, comprising:
   receiving a command at a command and address terminals;
   receiving a clock at a clock terminal;
   receiving a data clock at a data clock terminal, wherein the data clock includes a static period, has a first clock frequency following the static period, and has a second clock frequency following first clock frequency;
   providing a multiphase clock based on the data clock, the multiphase clock having a static period based on the static period of the data clock; and
   synchronizing the data clock to the clock by evaluating the multiphase clock during its static period.

2. The method of claim 1 wherein providing the multiphase clock comprises providing a plurality of multiphase clocks based on the data clock, the plurality of multiphase clocks having a lower clock frequency than the data clock.

3. The method of claim 1 wherein synchronizing the data clock to the clock by evaluating the multiphase clock comprising:
   delaying the multiphase clock to provide a delayed multiphase clock; and
   latching a clock level of the delayed multiphase clock responsive to the command, wherein a logic level of an output signal based on the latched clock level is indicative of a phase relationship.

4. The method of claim 1, wherein the command comprises a read command.

5. The method of claim 4, further comprising providing data responsive to the read command.

6. A method, comprising:
   issuing a command to a memory;
   providing a system clock to the memory; and
   driving a data dock to the memory, wherein the data clock driven to the memory is static for a first time period, has a first clock frequency for a second time period following the first time period, and has a second clock frequency following the second time period,
   wherein the data clock is synchronized to the system clock by the memory responsive to the command.

7. The method of claim 6, further comprising continuing to toggle the data clock following synchronization of the data clock to the system clock.

8. The method of claim 6 wherein the data clock is static at a low clock level for the first time period.

9. The method of claim 6 wherein the second clock frequency is twice the first clock frequency.

10. The method of claim 6 wherein the second clock frequency is four times a clock frequency of the system clock.

11. The method of claim 6 wherein the first time period is greater than the second time period.

12. A method comprising:
    receiving a data clock signal;
    providing multiphase clock signals based on the data clock signal, the multiphase clock signals each having a phase relationship with the data clock signal;
    delaying a multiphase clock signal of the multiphase clock signals to provide a delayed data clock signal;
    latching a logic level of the delayed data clock signal during a static period of the delayed data clock signal, wherein the delayed data clock signal remains at a constant clock level during the static period of the delayed data clock signal; and
    providing an output signal having a logic level indicative of the phase relationship of the multiphase clock signals with the data clock signal.

13. The method of claim 12, wherein:
    the data clock signal has a constant clock level before the data clock signal becomes active; and
    the delayed data clock signal becomes active based on the data clock signal becoming active.

14. The method of claim 12, wherein providing the multiphase clock signals based on the data clock signal comprises:
    providing a first multiphase clock signal having a clock edge associated with a first rising edge of the data clock signal;
    providing a second multiphase clock signal having a clock edge associated with a first falling edge of the data clock signal;
    providing a third multiphase clock signal having a clock edge associated with a second rising edge of the data clock signal; and
    providing a fourth multiphase clock signal having a clock edge associated with a second falling rising edge of the data clock signal.

15. The method of claim 14, wherein the clock edges of the first, second, third, and fourth multiphase clock signals are rising edges.

16. The method of claim 14, wherein the clock edges of the first, second, third, and fourth multiphase clock signals are falling edges.

17. The method of claim 14, wherein a first phase relationship is represented by the clock edges of the first, second, third, and fourth multiphase clock signals being rising edges.

18. The method of claim 17, wherein a second phase relationship is represented by the clock edges of the first, second, third, and fourth multiphase clock signals being falling edges.

19. The method of claim 12, wherein latching the logic level of the delayed data clock signal during the static period of the delayed data clock signal comprises matching a data clock path to a command path delay.

20. The method of claim 12, wherein the multiphase clock signals have a lower clock frequency than the data clock signal.

\* \* \* \* \*

UNITED STATES PATENT AND TRADEMARK OFFICE
CERTIFICATE OF CORRECTION

| | | |
|---|---|---|
| PATENT NO. | : 10,984,844 B2 | |
| APPLICATION NO. | : 16/452436 | |
| DATED | : April 20, 2021 | |
| INVENTOR(S) | : Hyun Yoo Lee et al. | |

It is certified that error appears in the above-identified patent and that said Letters Patent is hereby corrected as shown below:

In the Claims

| | Reads | Should read |
|---|---|---|
| Column 15, Line 63 Claim 6 | "driving a data dock to the memory" | -- driving a data clock to the memory -- |

Signed and Sealed this
Eighth Day of August, 2023

*Katherine Kelly Vidal*

Katherine Kelly Vidal
*Director of the United States Patent and Trademark Office*